United States Patent
Van Itallie

(10) Patent No.: US 6,423,609 B1
(45) Date of Patent: Jul. 23, 2002

(54) METHODS OF FORMING CAPACITORS ON A WAFER, PHOTOLITHOGRAPHIC METHODS OF FORMING CAPACITORS ON A WAFER, AND SEMICONDUCTOR WAFER

(75) Inventor: John F. Van Itallie, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/861,286

(22) Filed: May 18, 2001

(51) Int. Cl.[7] .............................................. H01L 21/20
(52) U.S. Cl. ...................... 438/396; 438/397; 438/386; 438/387; 257/296; 257/303; 257/306
(58) Field of Search .................................. 438/397, 253, 438/254, 396, 243, 190, 386, 387; 257/306, 296, 303

(56) References Cited

U.S. PATENT DOCUMENTS

| | | | |
|---|---|---|---|
| 4,987,099 A | 1/1991 | Flanner | 437/192 |
| 4,996,627 A | * 2/1991 | Zias et al. | 361/283 |
| 5,023,683 A | 6/1991 | Yamada | 357/23.6 |
| 5,032,882 A | 7/1991 | Okumura et al. | 357/23.6 |
| 5,061,650 A | 10/1991 | Dennison et al. | 437/47 |
| 5,084,414 A | 1/1992 | Manley et al. | 437/189 |
| 5,087,591 A | 2/1992 | Teng | 437/225 |
| 5,120,679 A | 6/1992 | Boardman et al. | 437/195 |
| 5,138,412 A | 8/1992 | Hieda et al. | 357/23.6 |
| 5,168,073 A | 12/1992 | Gonzalez et al. | 437/47 |
| 5,206,183 A | 4/1993 | Dennison | 437/47 |
| 5,250,457 A | 10/1993 | Dennison | 437/48 |

(List continued on next page.)

FOREIGN PATENT DOCUMENTS

| | | |
|---|---|---|
| DE | 42 20 497 A1 | 6/1992 |
| DE | 43 16 503 A1 | 5/1993 |
| JP | 2-275665 | 11/1990 |
| JP | 3-174765 | 7/1991 |
| JP | 2528608 | 8/1996 |

OTHER PUBLICATIONS

IBM Corp., *Stacked Capacitor DRAM Cell With Vertical Fins (VF–STC)*, 33 IBM Technical Disclosure Bulletin, No. 2, pp. 245–247 (Jul. 1990).

Toru Kaga et al., *Crown–Shaped Stacked–Capacitor Cell for 1.5–V Operation 64–Mb DRAMS's*, IEEE Transactions on Electron Devices, No. 2, pp. 255–260 (Feb. 1991).

K. Ueno et al., *A Quarter–Micron Planarized Interconnection Technology With Self–Aligned Plug*, IEEE, pp. 305–308 (1992).

U.S. patent application Ser. No. 09/652,601, filed Aug. 8, 2000, Tang.

U.S. patent application Ser. No. 09/810,586, filed Mar. 2001, Coursey.

U.S. patent application Ser. No. 09/810,595, filed Mar. 2001, Coursey.

*Primary Examiner*—David Nelms
*Assistant Examiner*—Tu-Tu Ho
(74) *Attorney, Agent, or Firm*—Wells St. John P.S.

(57) ABSTRACT

The invention includes methods of forming capacitors on a wafer, photolithographic methods of forming capacitors on a wafer, and to semiconductor wafers regardless of the method of fabrication. In one implementation, A method of forming capacitors on a wafer includes forming a dielectric well forming layer over the wafer. A protective rim is formed over the well forming layer proximate to and along at least a portion of the wafer's peripheral edge. Portions of the well forming layer are removed radially inward of the protective rim to form a plurality of wells within the well forming layer. A plurality of capacitors are formed within individual of the plurality of wells. One implementation includes a semiconductor wafer.

41 Claims, 18 Drawing Sheets

U.S. PATENT DOCUMENTS

| | | | |
|---|---|---|---|
| 5,770,499 A | 6/1998 | Kwok et al. | 438/253 |
| 5,990,021 A | 11/1999 | Prall et al. | 438/753 |
| 6,030,879 A | 2/2000 | Huang et al. | 438/397 |
| 6,054,394 A | 4/2000 | Wang | 438/753 |
| 6,057,206 A * | 5/2000 | Nguyen et al. | 438/401 |
| 6,130,126 A * | 10/2000 | Iwakiri | 438/253 |
| 6,200,898 B1 | 3/2001 | Tu | 438/692 |
| 6,232,168 B1 | 5/2001 | Coursey | 438/241 |
| 6,232,240 B1 | 5/2001 | Tung | 438/745 |
| 6,258,729 B1 | 7/2001 | DeBoer et al. | 438/745 |

* cited by examiner

METHODS OF FORMING CAPACITORS ON A WAFER, PHOTOLITHOGRAPHIC METHODS OF FORMING CAPACITORS ON A WAFER, AND SEMICONDUCTOR WAFER

TECHNICAL FIELD

This invention relates to methods of forming capacitors on a wafer, to photolithographic methods of forming capacitors on a wafer, and to semiconductor wafers.

BACKGROUND OF THE INVENTION

Memory circuitry in semiconductor fabrication is formed to include an array area where individual memory cells are typically fabricated in a dense repeating pattern, and a peripheral area where peripheral circuitry which is operatively configured to write to and read from the memory array is fabricated. Peripheral circuitry and array circuitry are typically largely fabricated at the same time. Further the memory cell capacitors within the memory array are commonly fabricated to be vertically elongated, sometimes in the shape of cups or containers, in order to maximize the available surface area for individual capacitors for storage capacitance. The electronic components or devices of the peripheral circuitry are not typically as vertically elongated, thereby creating topography problems in the fabrication due to portions of the memory array circuitry being fabricated significantly elevationally higher than portions of the peripheral circuitry.

SUMMARY

The invention includes methods of forming capacitors on a wafer, photolithographic methods of forming capacitors on a wafer, and to semiconductor wafers regardless of the method of fabrication. In one implementation, A method of forming capacitors on a wafer includes forming a dielectric well forming layer over the wafer. A protective rim is formed over the well forming layer proximate to and along at least a portion of the wafer's peripheral edge. Portions of the well forming layer are removed radially inward of the protective rim to form a plurality of wells within the well forming layer. A plurality of capacitors are formed within individual of the plurality of wells.

In one implementation, a semiconductor wafer includes a peripheral edge extending all about the wafer. An insulative layer is received over the semiconductor wafer and extends to proximate the wafer peripheral edge. The insulative layer includes a peripheral rim portion proximate to and extending about at least a portion of the wafer peripheral edge. A plurality of wells are formed in the insulative layer. Individual of said insulative layer wells include a plurality of capacitors. The peripheral rim portion is void of any of said insulative layer wells.

BRIEF DESCRIPTION OF THE DRAWINGS

Preferred embodiments of the invention are described below with reference to the following accompanying drawings.

FIG. 13 is a view of the FIG. 5 wafer fragment at a processing step subsequent to that shown by FIG. 12.

FIG. 14 is a view of the FIG. 5 wafer fragment at a processing step subsequent to that shown by FIG. 13.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

U.S. patent application Ser. No. 09/648,585, filed on Aug. 25, 2000, a portion of which is now U.S. Pat. No. 6,232,168, listing Belford T. Coursey as inventor, and titled "Memory Circuitry and Method Of Forming Memory Circuitry" is hereby fully incorporated by reference.

An issue that motivated the invention is described initially with reference to FIGS. 1–4 in the fabrication of capacitor-over-bit line dynamic random access memory circuitry. However, the invention is in no way so limited, and further is applicable without limitation to any stated or implied issues or objectives, with the invention only being limited by the accompanying claims as literally worded and appropriately interpreted in accordance with the doctrine of equivalents.

Figure 1:
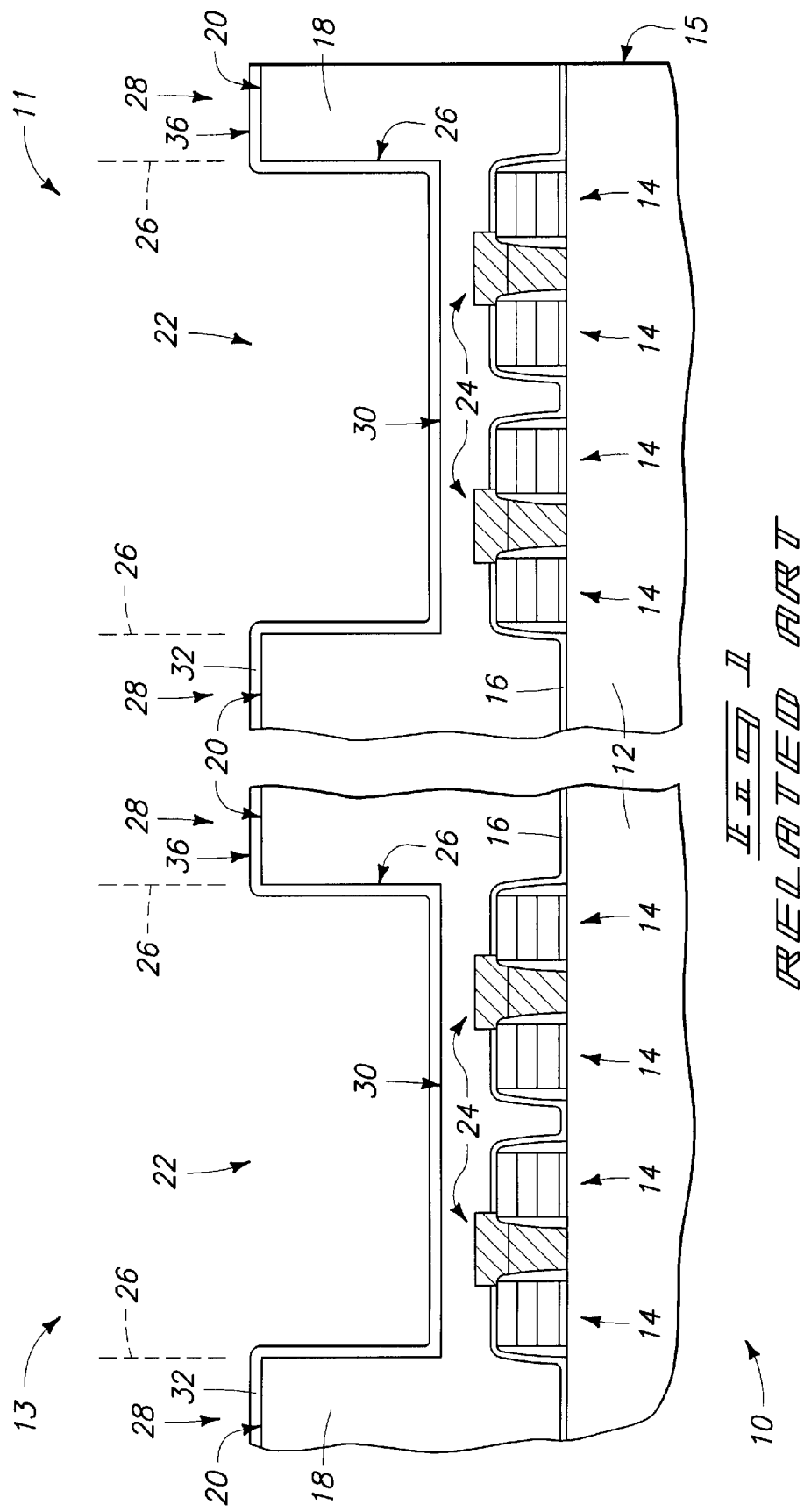
FIG. 1 is a diagrammatic fragmentary sectional view of a related art semiconductor wafer fragment.

Referring initially to FIG. 1, a semiconductor substrate in the form of a wafer fragment is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Further in the context of this document, the term "layer" encompasses both the singular and the plural.

In only a preferred embodiment, memory circuitry, and more particularly dynamic random access memory circuitry, is fabricated and described. Semiconductor wafer fragment 10 comprises a bulk monocrystalline substrate 12. The depicted fragmentary view is of a semiconductor wafer 10 having a peripheral edge portion 11 and a portion 13 received laterally or radially inward thereof. Wafer 10 includes a peripheral edge 15. Typical photolithographic patterning patterns the entire outer surface of the wafer clear to peripheral edge 15, and conducts most if not all subsequent wafer processing at edge portion 11 the same as within wafer portion 13. Yet edge effects in photolithography and subsequent processing can cause features formed in peripheral edge portion 11 to be deformed relative to features formed in portion 13 displaced from the outermost edge of the wafer. It is therefore typically anticipated that some portion of the outermost peripheral edge of a wafer will not produce usable circuitry/die.

Wafer 10 has been processed to have an array of word lines 14 formed thereover. Such are shown as comprising a gate oxide layer, an overlying conductively doped polysilicon layer, an overlying silicide layer, and finally an overlying insulative cap. Anisotropically etched insulative sidewall spacers are received about word lines 14. Such components are not designated with numerals. Capacitor storage node plugs 24 are received between the illustrated word lines, and constitute exemplary storage node contact locations as will be apparent from the continuing discussion. An array of digit lines would be formed in a wafer section outside that shown in FIG. 1. An insulative layer 16 is received between the digit lines and substrate 12, and would expose a digit line contact location between the middle two illustrated word lines in said wafer section outside that shown in FIG. 1. An example material for layer 16 is undoped $SiO_2$ deposited by decomposition of tetraethylorthosilicate. An exemplary thickness is from about 300 Angstroms to about 500 Angstroms. Suitable source/drain constructions (not shown) would be provided relative to substrate 12 as is conventional, or as might be developed in later generation technologies.

A dielectric well forming layer 18 is formed over semiconductor substrate 12 over word lines 14 and the bit lines. An example preferred material includes doped silicon dioxide, such as borophosphosilicate glass (BPSG) deposited to an exemplary thickness range of from about 10,000 Angstroms to about 30,000 Angstroms, and is preferably composed to consist essentially of a doped silicon dioxide. Preferably, as shown, such comprises an outer planar surface 20. A portion of dielectric/insulative well forming layer 18 is removed to form a plurality of wells 22 within well forming layer 18. Such patterning and removal most preferably occurs by photolithography whereby the area outside of well portion 22 is masked with photoresist, and a timed etched is preferably then conducted of layer 18 using a chemistry substantially selective to not remove the photoresist to form the illustrated wells 22. Wells 22 include a periphery 26, which peripherally defines an outline of a memory array area and an area 28 peripheral and laterally outward of wells 22 which comprises memory peripheral circuitry area. Wells 22 also include a base 30 which, in the preferred illustrated embodiment, is substantially planar.

The etch to produce the illustrated wells 22 is preferably timed to provide a lowest portion 30 thereof which is received above the word line caps by at least 2000 Angstroms. Further, lowest portion 30 is preferably received above outermost tops of the digit lines (not shown) by at least 1000 Angstroms and preferably less than 4000 Angstroms. A more preferred distance between base 30 and the outermost tops of the digit lines is from about 2500 Angstroms to about 3500 Angstroms, with 3000 Angstroms being a specific preferred distance.

Still referring to FIG. 1, an etch stop layer 32 (preferably dielectric) is preferably deposited over well forming layer 18 outwardly of and to within wells 22 to less than completely fill wells 22. An exemplary and preferred material for layer 32 is silicon nitride, with an exemplary preferred deposition thickness being from about 40 Angstroms to about 125 Angstroms, with from about 50 Angstroms to 70 Angstroms being more preferred. Such provides an insulative layer 32/18 outermost surface 36 which, in the illustrated and preferred embodiment, is substantially planar laterally outside of wells 22.

Figure 2:
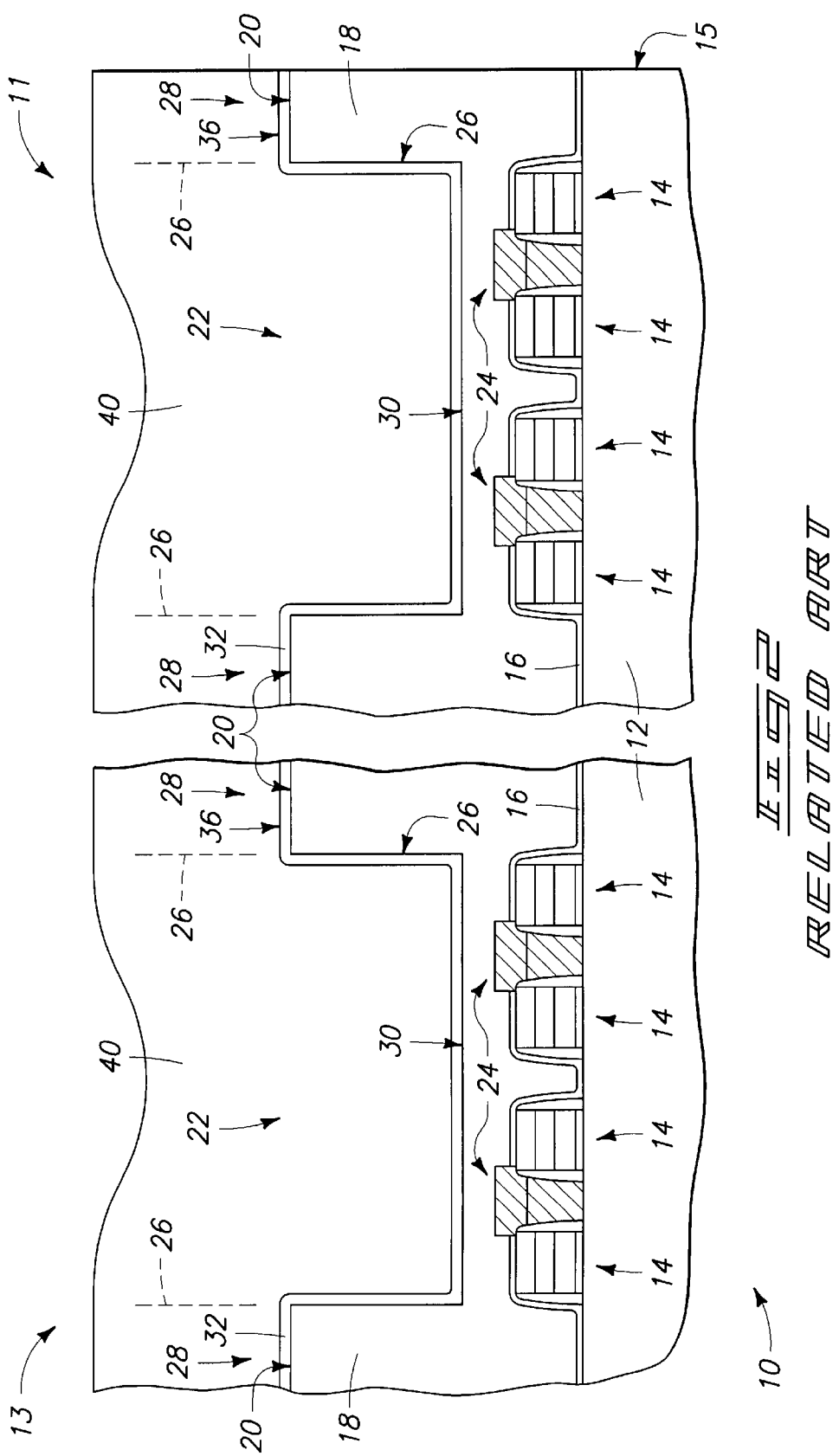
FIG. 2 is a view of the FIG. 1 related art wafer fragment at a processing step subsequent to that shown by FIG. 1.

Referring to FIG. 2, a storage node forming layer 40 is formed over etch stop layer 32 laterally outward of and to within wells 22 to overfill wells 22. Layer 40 preferably comprises a dielectric material, with BPSG being but one example. In the depicted embodiment, storage node forming layer 40 is initially formed to be substantially non-planar.

Figure 3:
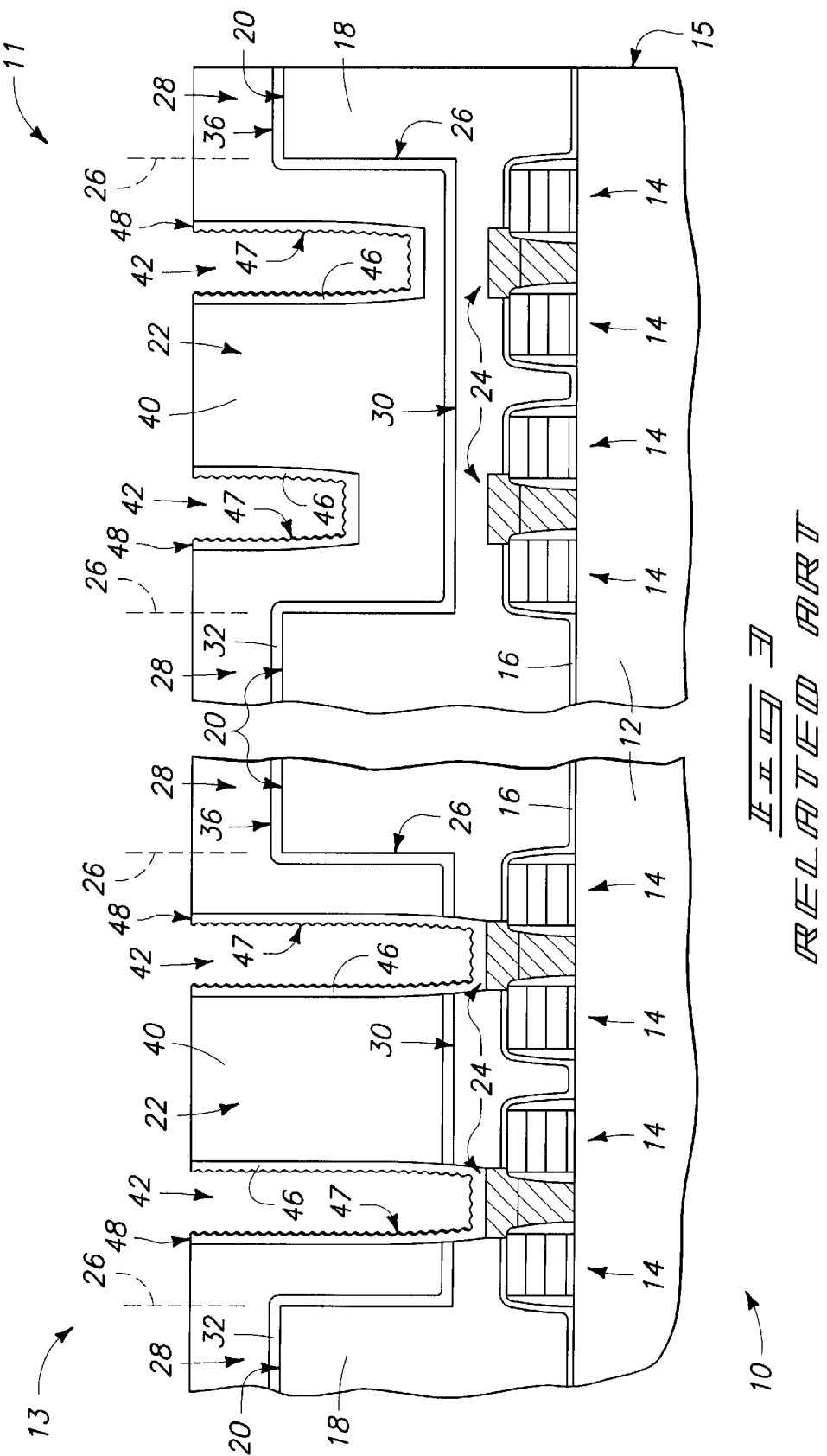
FIG. 3 is a view of the FIG. 1 related art wafer fragment at a processing step subsequent to that shown by FIG. 2.

Referring to FIG. 3, storage node forming layer 40 is planarized. Preferably, the planarization is such to be effective to leave etch stop layer 32 covered by storage node forming layer 40 of a thickness of at least about 1,000 Angstroms outside of wells 22. Planarization might occur by resist-etch back, chemical-mechanical polishing, or any other existing or yet-to-be-developed planarizing technique. An array of first capacitor storage node openings 42 is formed into storage node forming layer 40. An intent is to form the same through etch stop layer 32, and into well forming layer 18 through well base 30 and over storage node contact locations/plugs 24. However due to edge effects in the processing, some openings 42 in wafer peripheral edge portion 11 only extend to within storage node forming layer 40, for example as shown.

A capacitor storage node layer 46 (preferably hemispherical grain polysilicon, HSG) is formed preferably by chemical vapor depositing over storage node forming layer 40 to within capacitor storage node openings 42 to less than completely fill such openings. Such is removed outwardly of storage node forming layer 40 effective to form an array of storage node capacitor electrodes 47 in electrical connection with storage node contact locations/plugs 24 within wafer region 13. Preferably, storage node capacitor electrodes 47 comprise a portion which has a container shape, with the portion being formed to be partially received within well forming layer 18 through the base openings within wells 22. Non-container capacitor electrode constructions are also of course contemplated. Removal can occur by any of a number of techniques, with chemical-mechanical polishing being preferred. Capacitor storage node containers 47 can have topmost surfaces 48 which are preferably received elevationally within 50 Angstroms of outermost surface 36 of insulative layer 32/18. The non-connecting of containers 47 with plugs 24 in peripheral edge portion 11 would not otherwise be expected to be of significance due to this being anticipated at the outset to be area not expected to produce usable circuitry.

Figure 4:
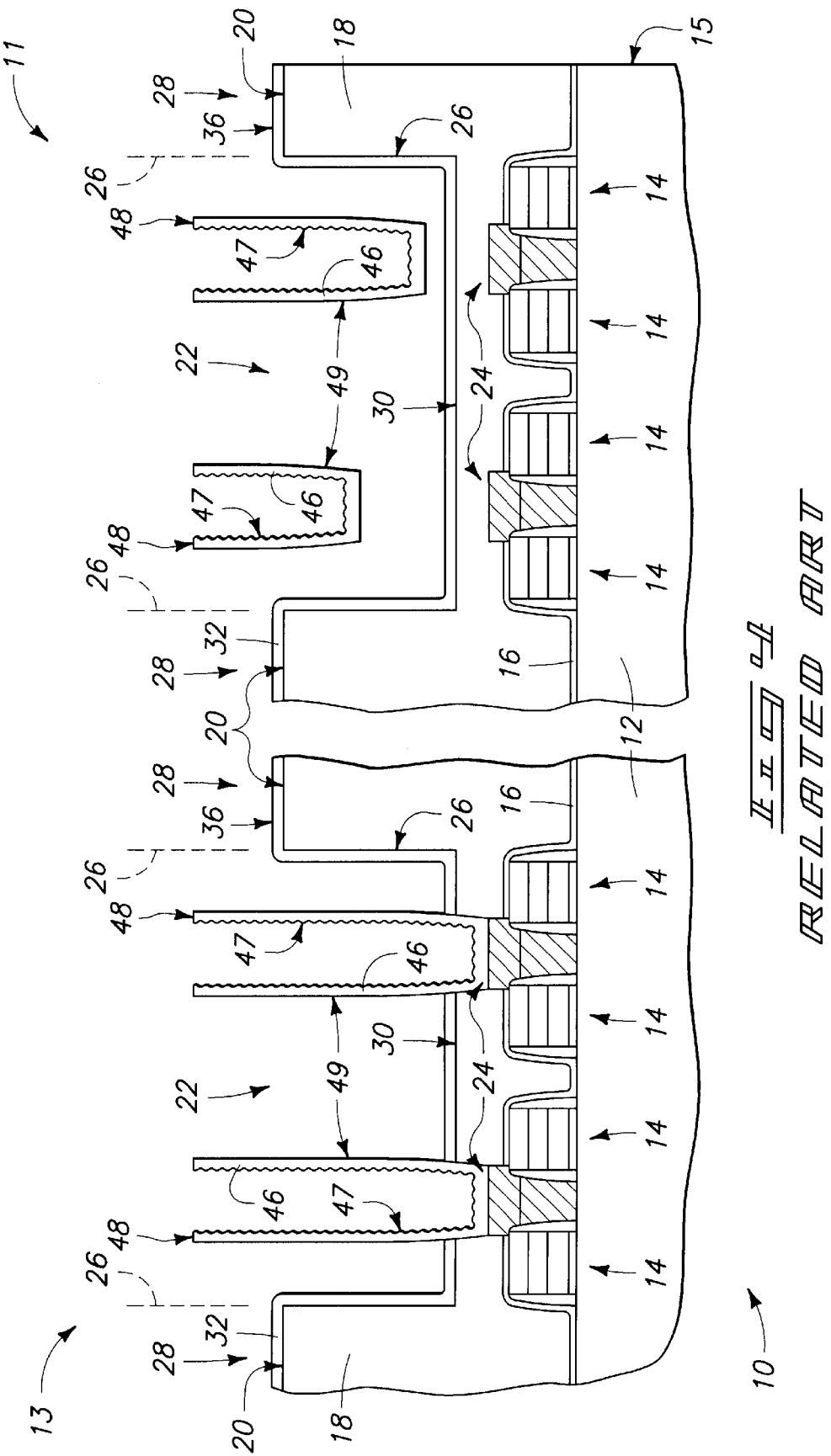
FIG. 4 is a view of the FIG. 1 related art wafer fragment at a processing step subsequent to that shown by FIG. 3.

However referring to FIG. 4, at least some of capacitor storage node forming layer 40 is typically next removed from within wells 22. Preferably, such removal occurs by chemical etching using a chemistry which is substantially selective to remove capacitor storage node forming layer 40 relative to etch stop layer 32, and as well exposes lateral outer container surface area 49 of capacitor containers 47. As illustrated and preferred, substantially all of capacitor storage node forming layer 40 is shown as having been etched from the substrate using dielectric etch stop layer 32 as an etch stop. Where layer 40 comprises BPSG and layer 32 comprises silicon nitride, an exemplary chemistry is dilute HF at a 10:1 volume ratio. Problematically, this can leave the right illustrated containers 47 in peripheral edge portion 11 without any support, resulting in their transport to and contamination of usable wafer area 13.

Figure 5:
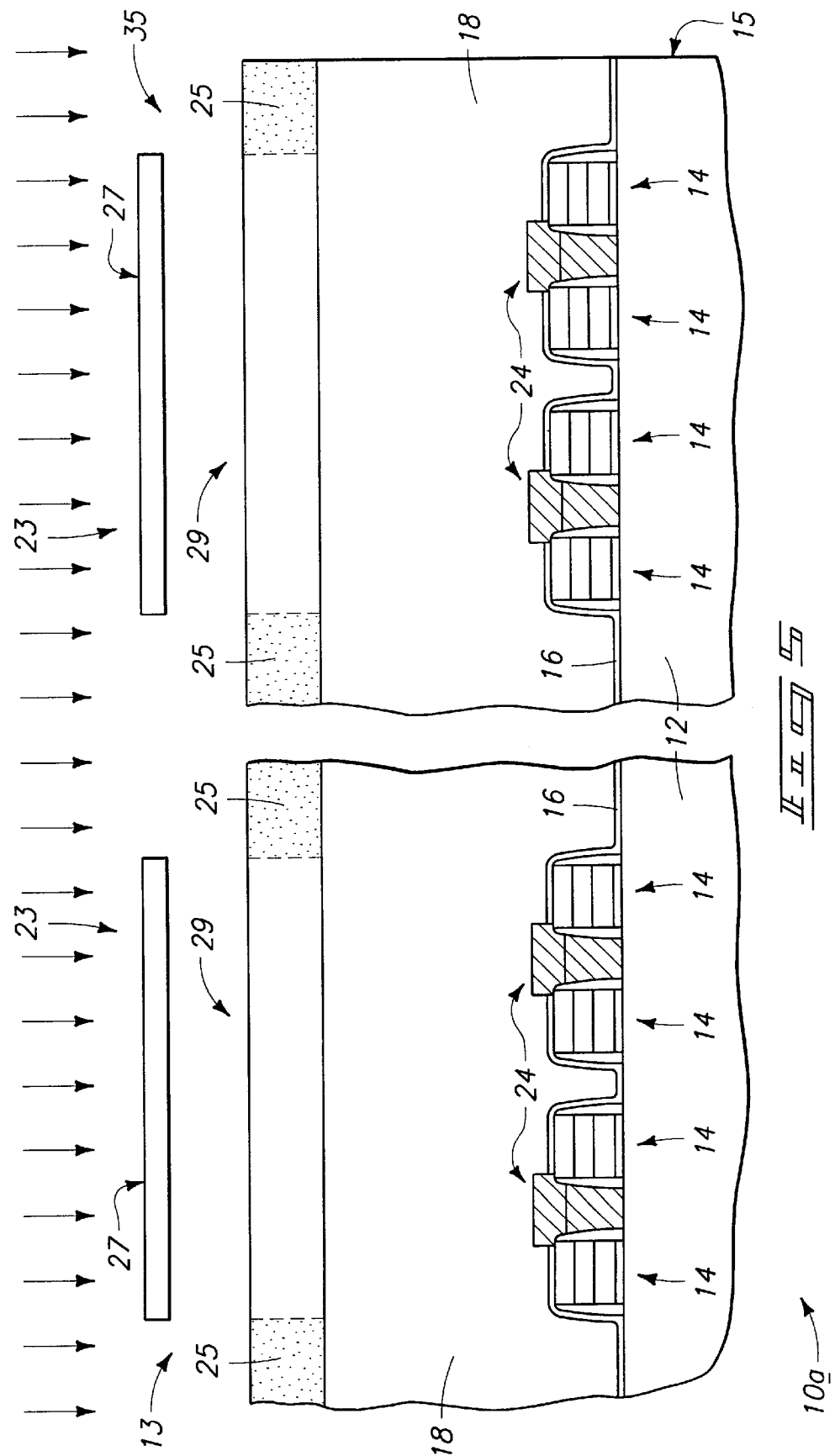
FIG. 5 is a diagrammatic fragmentary sectional view of a semiconductor wafer fragment at one processing step in accordance with an aspect of the invention.
Figure 6:
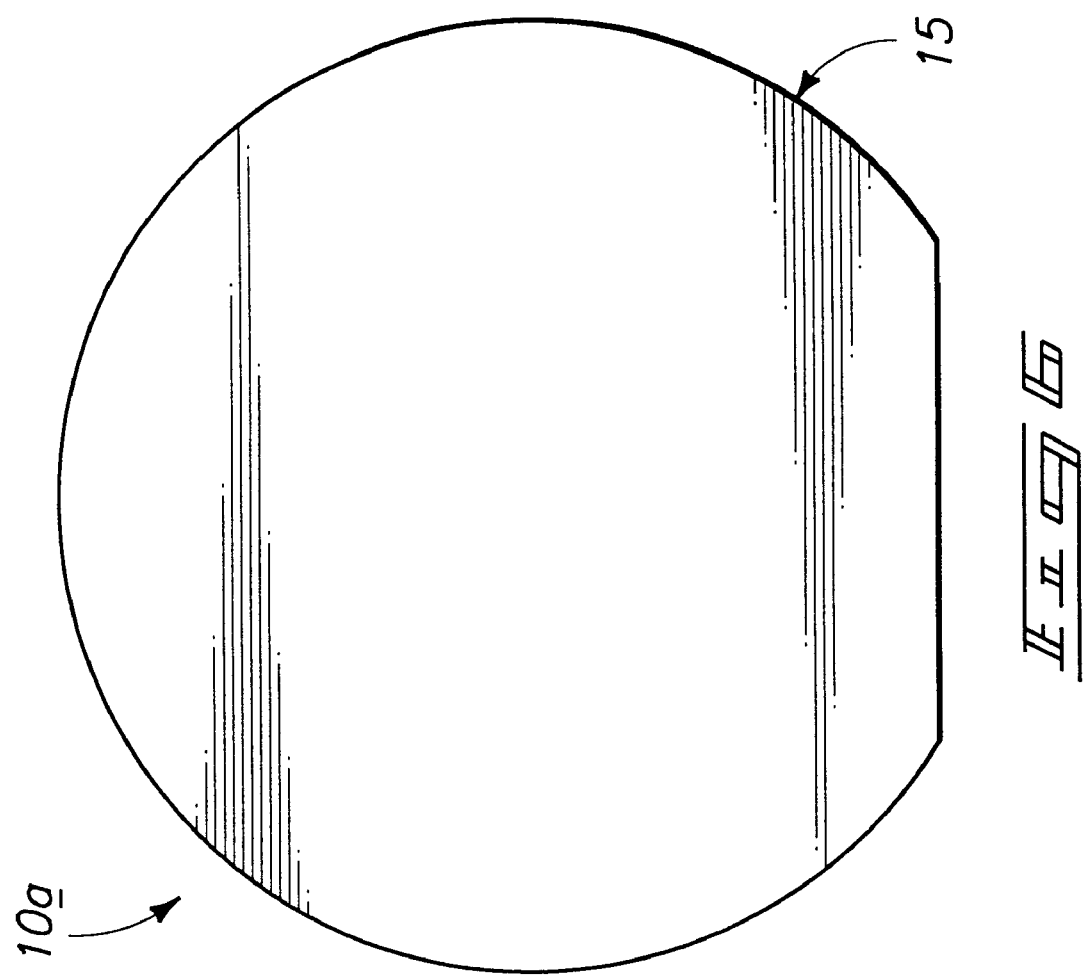
FIG. 6 is a reduced scale diagrammatic top plan view of the wafer of FIG. 5.

Referring to FIGS. 5 and 6, a method of forming capacitors on a wafer in accordance with aspects of the invention is described with respect to a wafer fragment 10a. Like numerals from FIGS. 1–4 are utilized where appropriate, with differences being indicated by the suffix "a" or with different numerals. Wafer 10a includes a peripheral edge 15 extending all about the wafer. A dielectric well forming layer 18 is formed over wafer 10a (FIG. 5). Such is accordingly preferably an insulative layer and extends to proximate wafer peripheral edge 15, and preferably itself has an outermost edge laterally coincident therewith. Further, such is preferably planarized as shown.

In one embodiment, a photoresist layer 25 is deposited, preferably in a blanket manner, over the wafer over well forming layer 18. In a most preferred embodiment, photoresist layer 25 preferably comprises a negative photoresist, thereby being soluble as-deposited in some suitable photoresist solvent. Positive or other photoresist might be alternately utilized, although negative photoresist is most preferred in this particular aspect of the invention. A clear-field reticle 23 is then preferably used, having masking regions 27 which comprise a plurality of well forming regions which, in the preferred embodiment, are preferably entirely opaque. Clear-field reticle 23 is stepped and exposed over an entirety of wafer 10a over blanket deposited negative photoresist 25, thereby changing the composition of the exposed regions of the photoresist to an insoluble form (indicated by the stippled areas of layer 25) in a suitable photoresist solvent. Such thereby forms a pattern of well forming regions 29 in negative photoresist 25.

Figure 7:
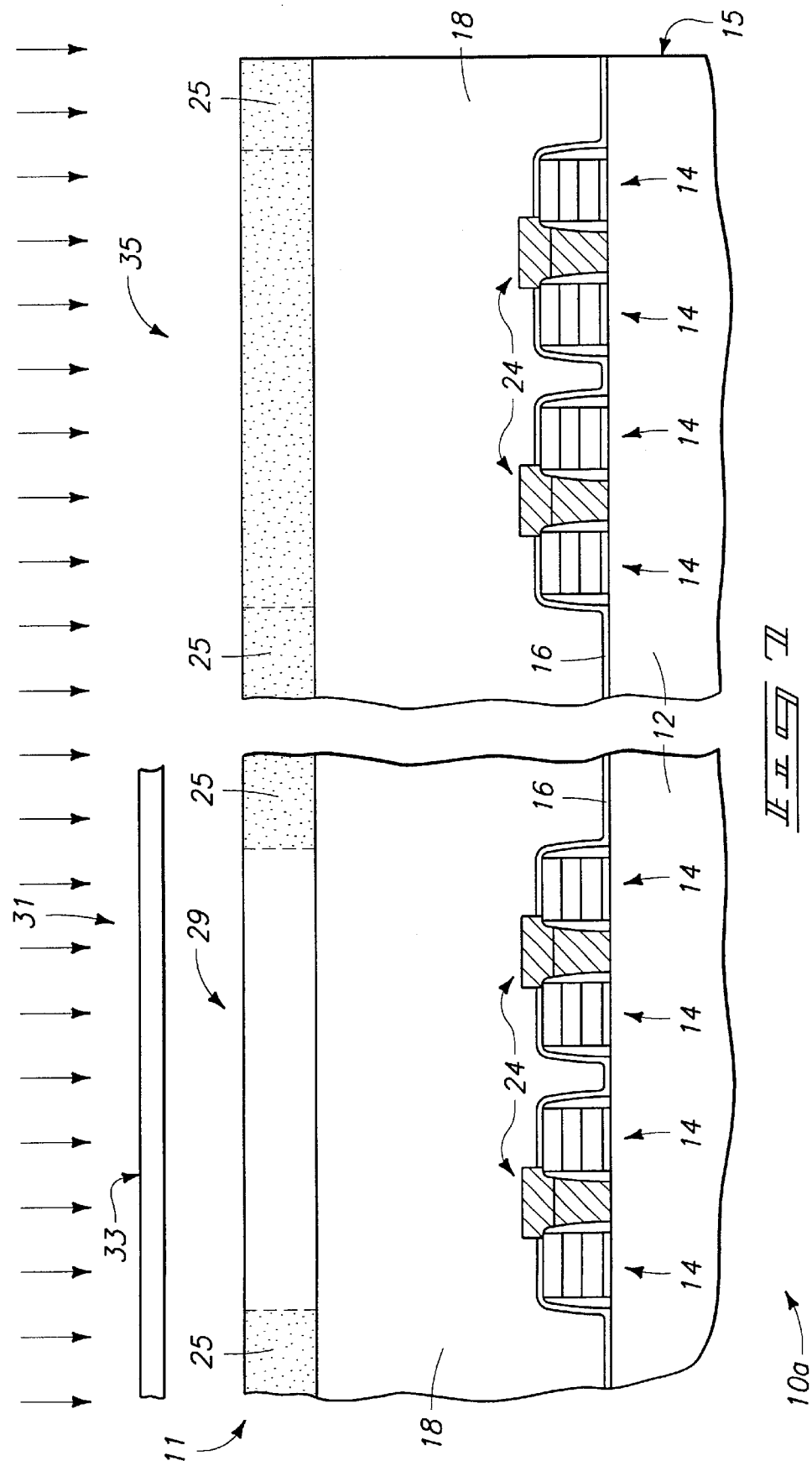
FIG. 7 is a view of the FIG. 5 wafer fragment at a processing step subsequent to that shown by FIG. 5.

Referring to FIG. 7, a wafer edge exposure tool 31 is utilized which preferably has a portion 33 which masks an entirety of a non-peripheral portion 13 of wafer 10a and leaves open a peripheral portion 35 proximate and preferably at and overlapping wafer peripheral edge 15. Using such tool 31, peripheral edge portion 35 of negative photoresist 25 is exposed to suitable radiation proximate to and preferably all about wafer periphery 15. Previous regions 29 formed in photoresist 25 in peripheral portion 35 thereby effectively disappear.

Figure 8:
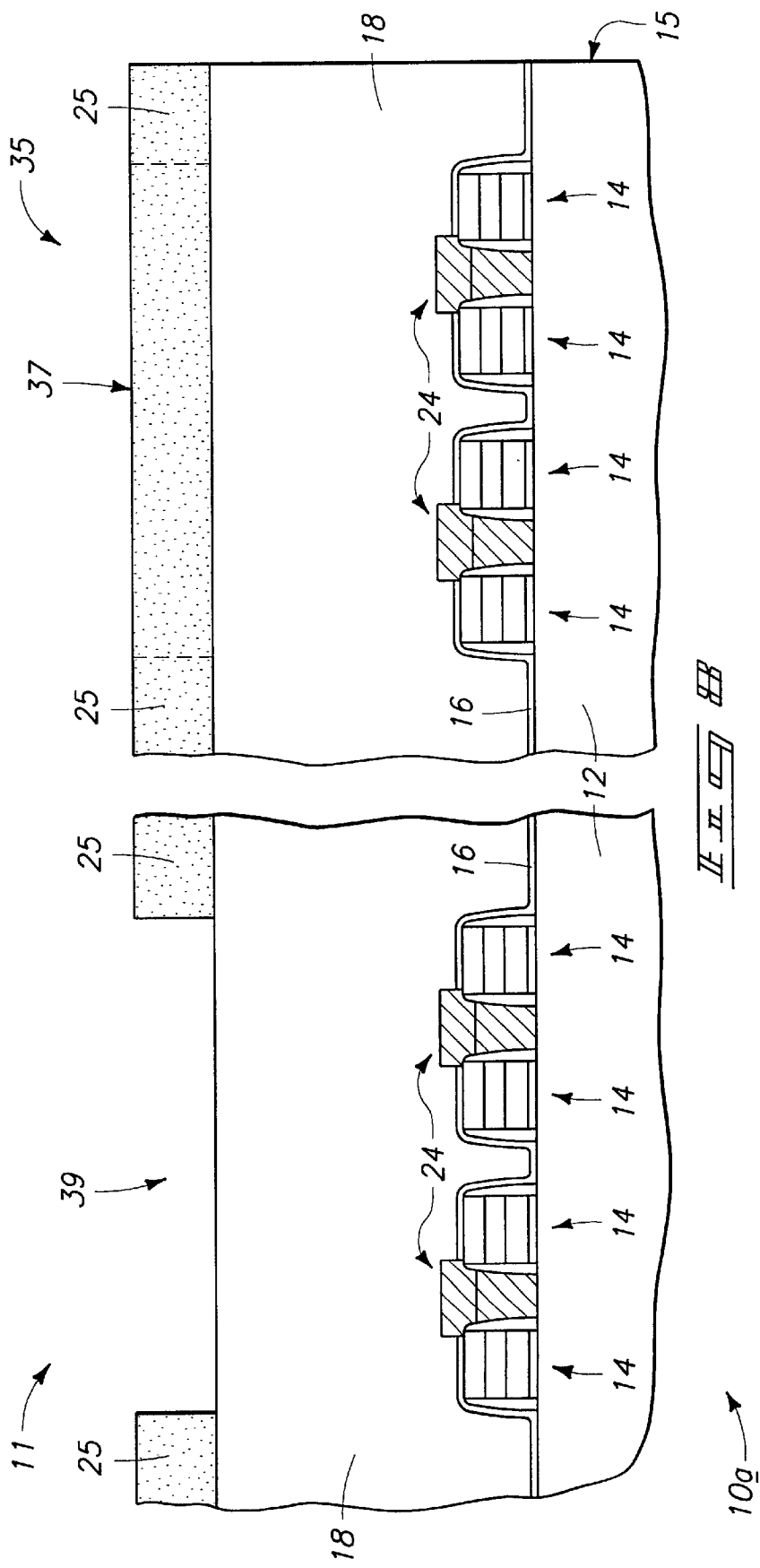
FIG. 8 is a view of the FIG. 5 wafer fragment at a processing step subsequent to that shown by FIG. 7.
Figure 9:
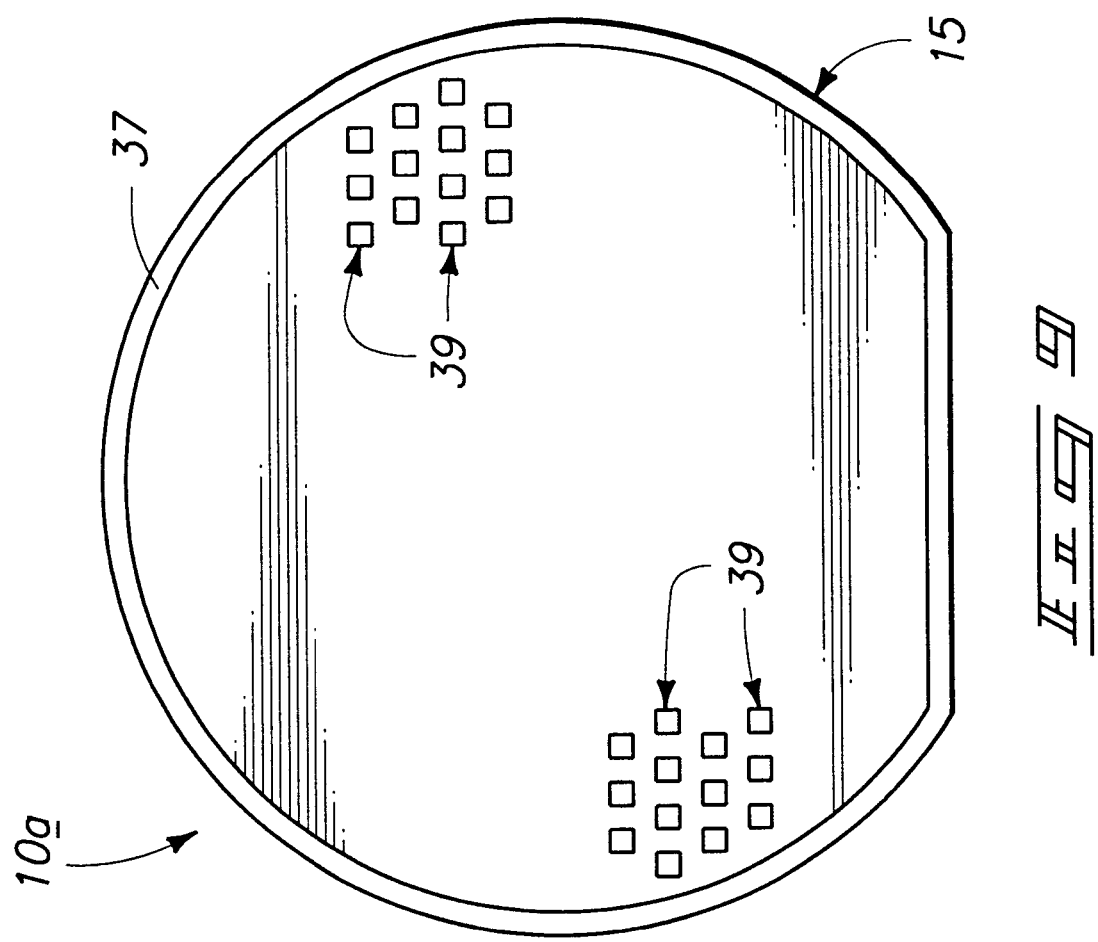
FIG. 9 is a reduced scale diagrammatic top plan view of the wafer of FIG. 8.

Referring to FIGS. 8 and 9, the wafer has been processed with a suitable developer to remove the photoresist from well forming regions 29 which were unexposed or masked from the suitable radiation. Such provides one example of patterning photoresist 25 and thereby leaving a protective rim 37 proximate to and along at least a portion of wafer peripheral edge 15, and forms a pattern of well openings 39 through photoresist 25 radially inward of peripheral edge portion 37. Further preferably, no well openings 39 are formed anywhere within protective rim 37.

The above-described embodiment uses the wafer edge exposure tool after the stepping and exposing with the clear-field reticle. Alternately but less preferred, the wafer edge exposure tool could be used prior to the stepping and exposing with the clear-field reticle. Further in the described preferred embodiment, the protective rim is preferably formed along all of wafer peripheral edge 15, and with itself having a peripheral edge which is laterally coincident with wafer peripheral edge 15. A preferred width for protective rim 37 is preferably at least 0.4 mm from edge 15 when laterally coincident therewith, and more preferably at an exemplary width of from 0.4 mm to 4.0 mm.

Figure 18B:
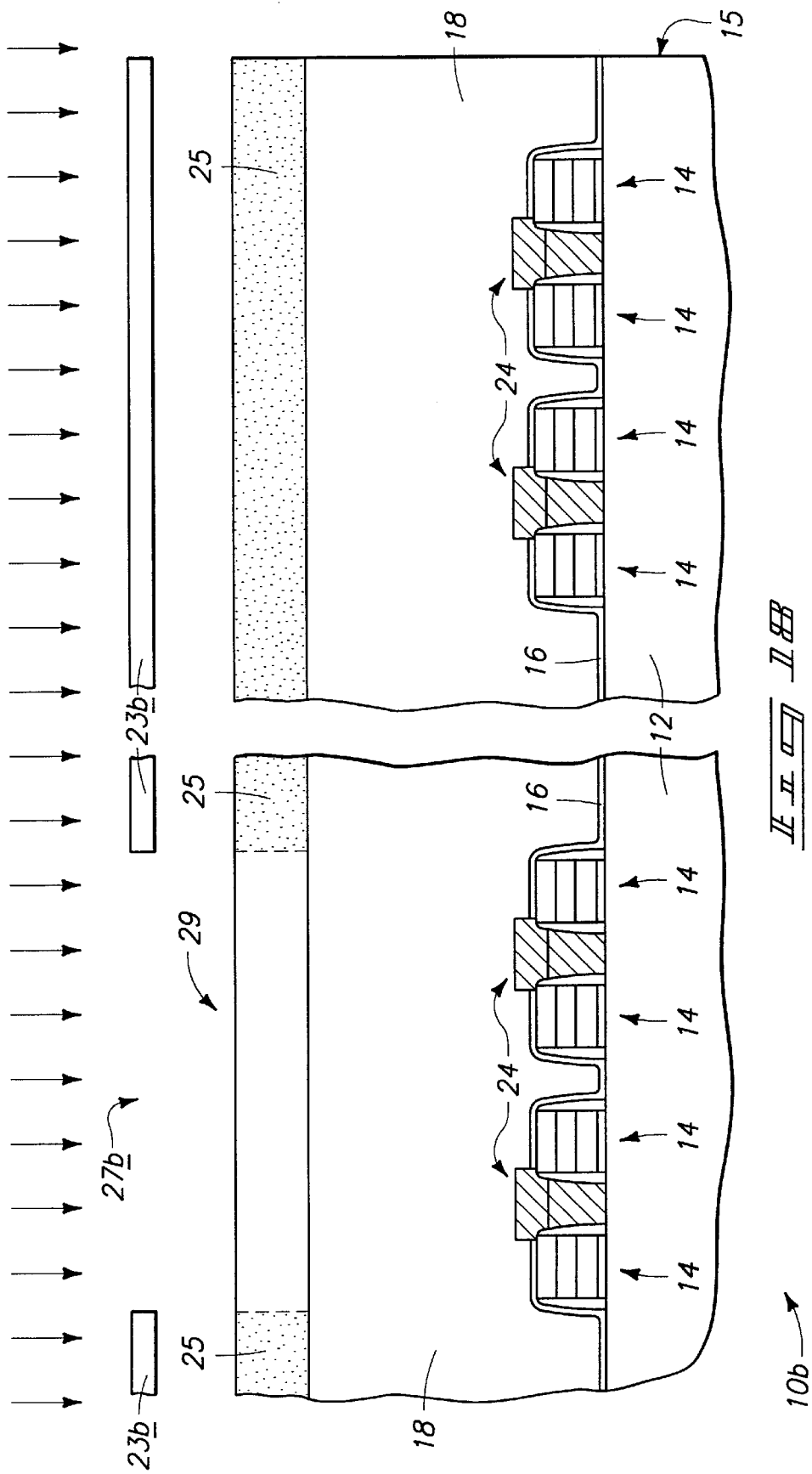
FIG. 18 is a diagrammatic fragmentary sectional view of an alternate embodiment semiconductor wafer fragment to that depicted by FIG. 5 at one processing step in accordance with an aspect of the invention.

Alternately, but less preferably, the above-mentioned process can be achieved with positive tone resist. Referring to FIG. 18, a wafer 10b has a positive tone photoresist deposited, preferably in a blanket manner, over the wafer over well forming layer 18. A dark-field reticle 23b is then preferably used having clear regions 27b which comprise a plurality of well forming regions. Dark-field reticle 23b can be a reduction reticle, a 1×reticle, or another reticle.

In the case of the reduction reticle, the reticle is stepped and exposed over the entirety of the wafer except for at areas proximate to peripheral edge 15. Areas proximate to peripheral edge 15 are not exposed with dark-field reticle 23b, either by use of adjusting reticle blades within the stepper device to prevent such exposure, or by simply not stepping and exposing the reticle in areas proximal to the wafer peripheral edge.

In the case of the 1×reticle, the reticle is designed to be dark-field in nature with clear openings to define well forming areas in positive tone photoresist. The reticle is drawn to the exact dimensions of the wafer and is at least the same size as the wafer. The reticle is not stepped and exposed as described above, but rather exposed once over the entirety of the wafer with no movement of the wafer or reticle necessary. The reticle is designed to be preferably completely opaque at areas proximate to and along at least a portion of wafer peripheral edge 15, so as to not expose resist in these areas.

In both cases, wafer 10b is exposed in such a way as to print a plurality of wells across the wafer using positive tone photoresist. Furthermore, wafer 10b is not exposed in areas proximate to and along at least a portion of peripheral edge 15, thus leaving a protective rim of photoresist 25 radially inward of peripheral edge portion 37. Further preferably, no well openings are formed anywhere within protective rim 37.

This is meant as an example of two methods of photolithographically forming wells on the wafer while leaving a protective rim of photoresist at the edge of the wafer in which no well openings are formed. This by no means limits this invention to these two methods, but rather extends to any method of forming wells along the surface of the wafer while leaving a protective rim at the edge of the wafer.

Figure 10:
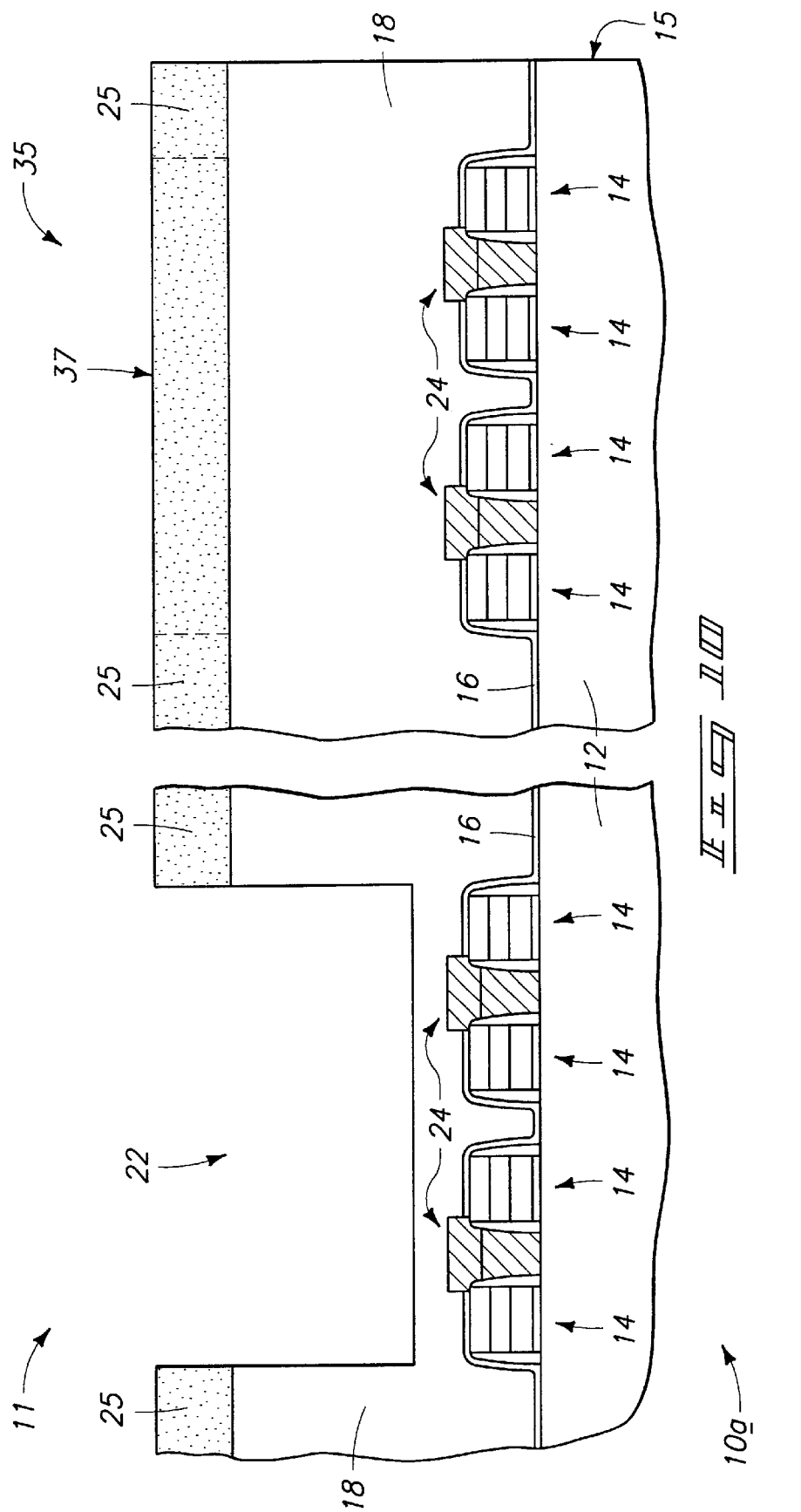
FIG. 10 is a view of the FIG. 5 wafer fragment at a processing step subsequent to that shown by FIG. 8.

Referring to FIG. 10, portions of well forming layer 18 are removed radially inward of protective rim 37 to form a plurality of wells 22 within well forming layer 18. Such removing preferably comprises chemical etching, and preferably uses patterned photoresist layer 25 as a mask. Further in the preferred embodiment, no wells 22 are formed within wafer peripheral edge portion 13, which is masked by protective rim 37. Accordingly in the preferred embodiment, protective rim 37 is used as a mask for a chemical etching step, which constitutes the preferred stated removing. Any suitable material other than photoresist might also be utilized, but is significantly less a preferred in light of the probable additional masking or other photolithographic processing which would likely be required. By way of example only, alternate materials include silicon dioxide, silicon nitride or any other insulative or conductive material which in the preferred embodiment provides a mask for chemical etching well forming layer 18 in a substantially selective manner to the masking layer.

Figure 11:
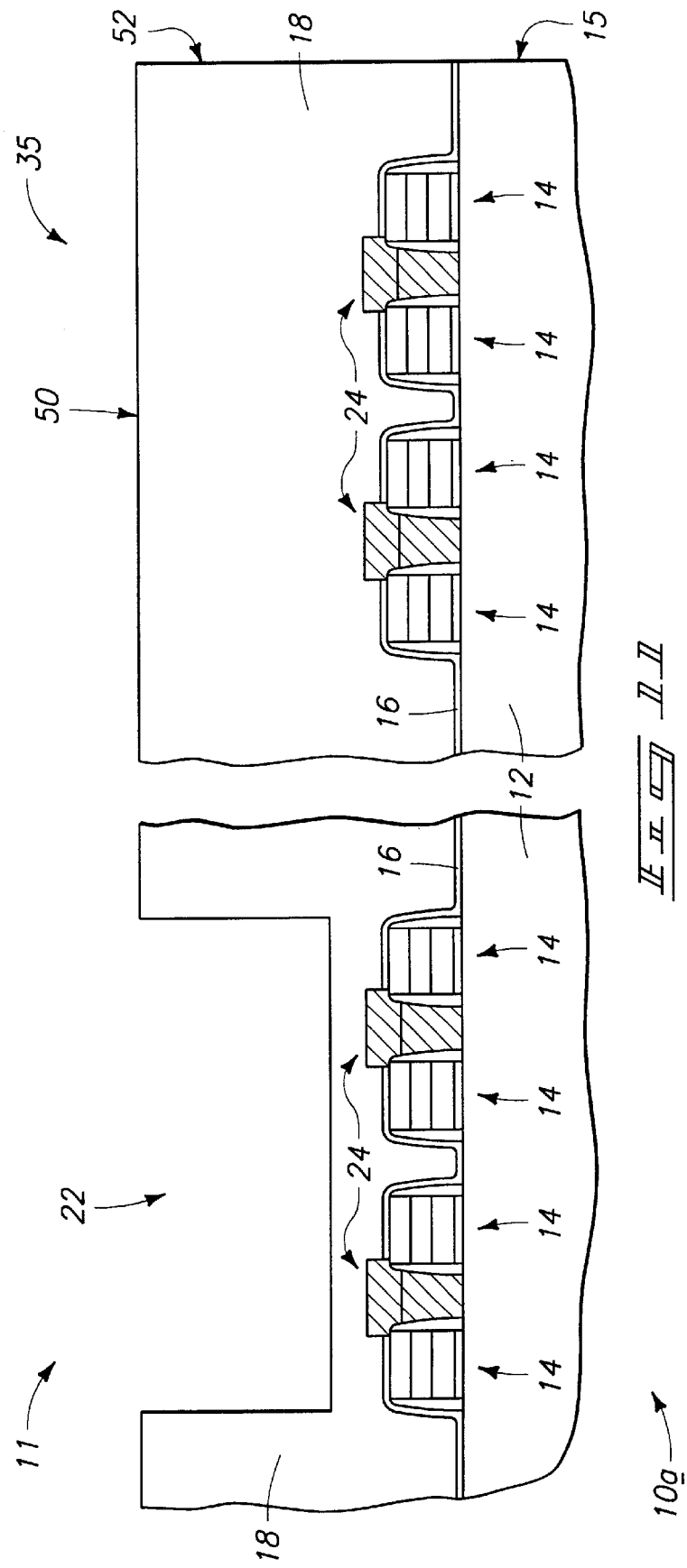
FIG. 11 is a view of the FIG. 5 wafer fragment at a processing step subsequent to that shown by FIG. 10.

Referring to FIG. 11, in the preferred embodiment, protective rim 37 and remaining portions of photoresist layer 25 are now removed from wafer 10a, in part leaving a peripheral rim portion 50 of insulative layer 18 received proximate to and extending about at least a portion of wafer peripheral edge 15. In the illustrated and preferred embodiment, peripheral rim portion 50 has a peripheral edge 52 which is laterally coincident with wafer peripheral edge 15. Further, peripheral rim portion 50 is preferably at least 0.4 mm wide, and more preferably from 0.4 mm to 4.0 mm wide, and extends all about wafer peripheral edge 15.

Figure 12:
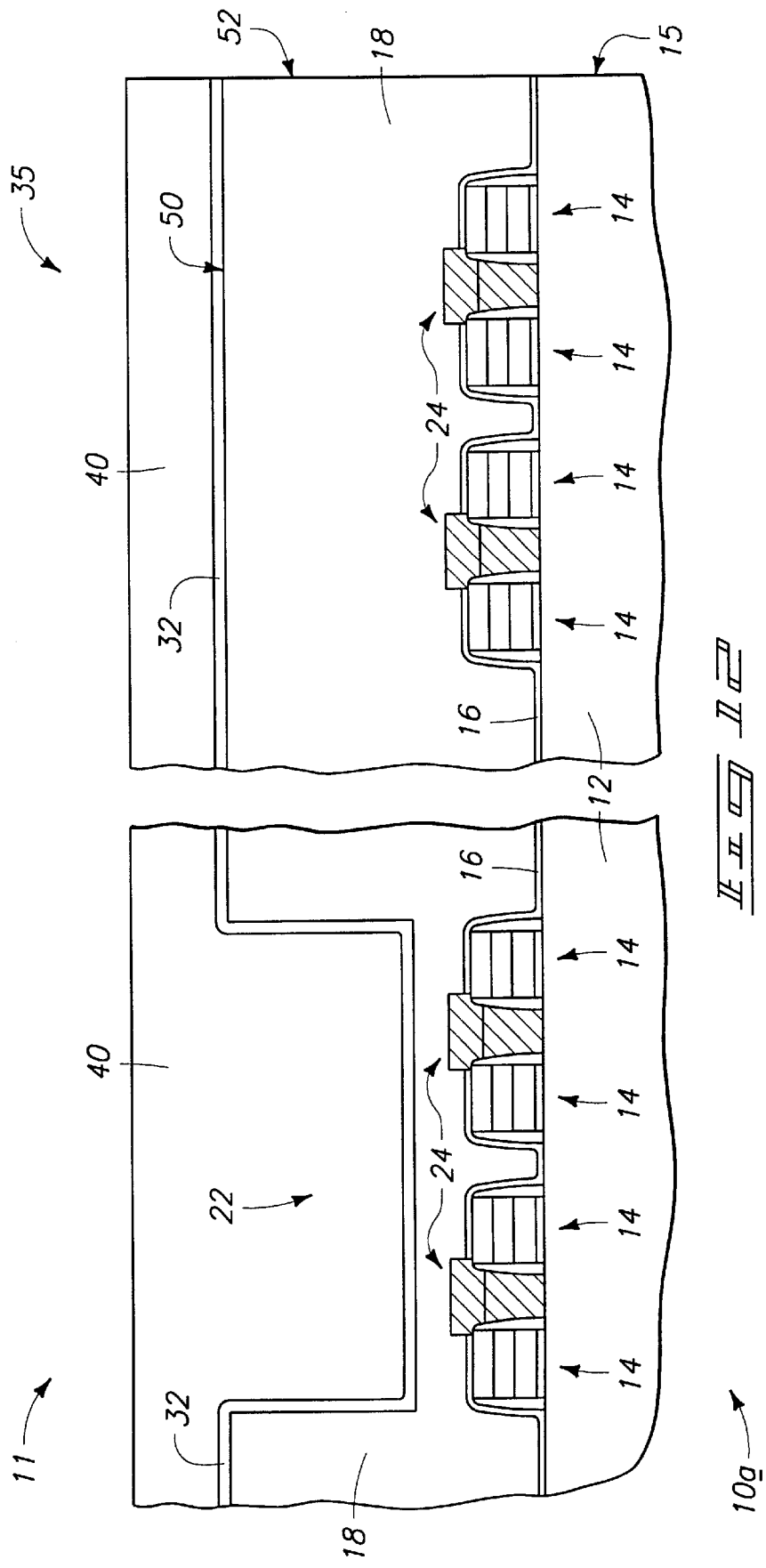
FIG. 12 is a view of the FIG. 5 wafer fragment at a processing step subsequent to that shown by FIG. 11.
Figure 11:
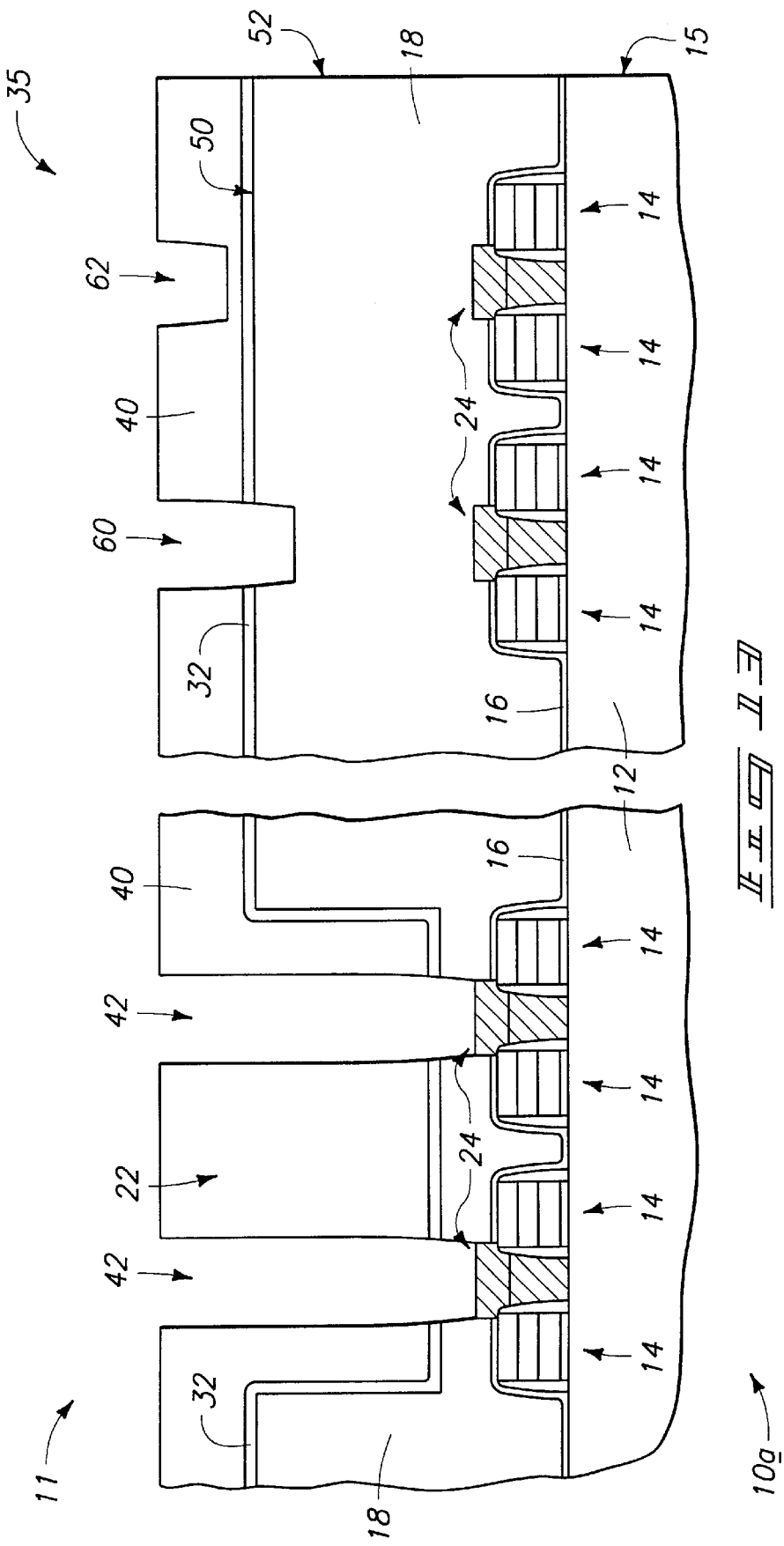
Figure 11:
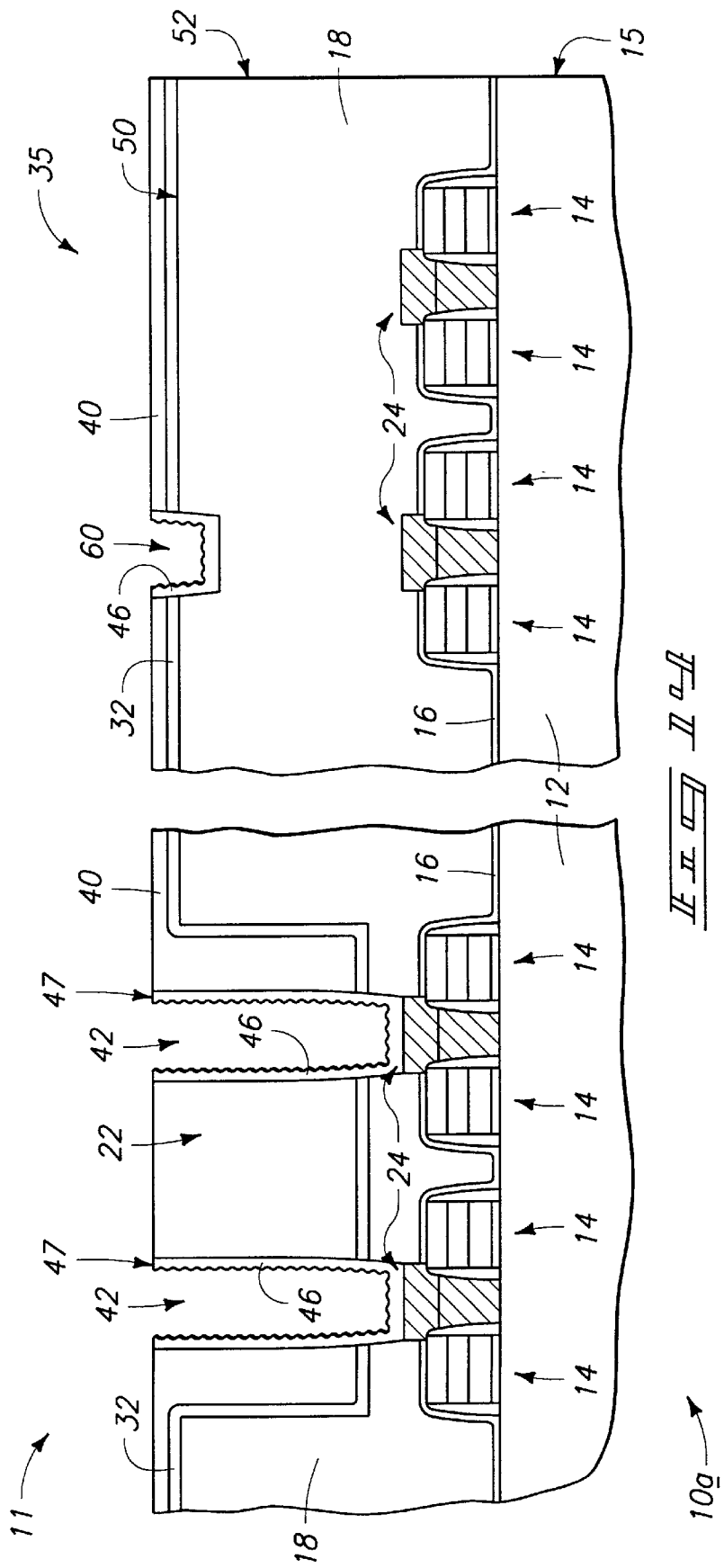

Referring to FIG. 12, an etch stop layer 32 is preferably deposited over wafer 10a to line wells 22. A capacitor storage node forming layer 40 is formed over layer 32 laterally outward of and to within wells 22 to overfill wells 22. Such is preferably planarized back as shown, preferably effectively to leave layer 32 covered by storage node forming layer 40 of a thickness of at least about 1,000 Angstroms outside of wells 22.

Referring to FIG. 13, an array of first capacitor storage node openings 42 are formed within capacitor storage node forming layer 40 within individual of wells 22, and an array of second openings 60/62 are formed into dielectric well forming layer 40 peripherally of wells 22. At least some of such second openings (i.e., opening 60) extend into dielectric well forming layer 18 through layer 32, with both of the illustrated second openings 60/62 extending within capacitor storage node forming layer 40. Thereby in one embodiment, only some (and preferably "most", but not all) of the second openings (i.e., opening 60) extend at least partially into well forming layer 18.

Referring to FIG. 14, a capacitor storage node electrode layer 46 is deposited within first capacitor storage node openings 42 and second openings 60/62. As shown, preferably in a common planarizing step, caparcitor storage node electrode layer 46 has been planarize polished, along with capacitor storage node forming layer 40, back to, or at least proximate to as shown, etch stop layer 32, but leaves layer 32 intact. Such forms capacitor storage node containers 47.

Figure 15:
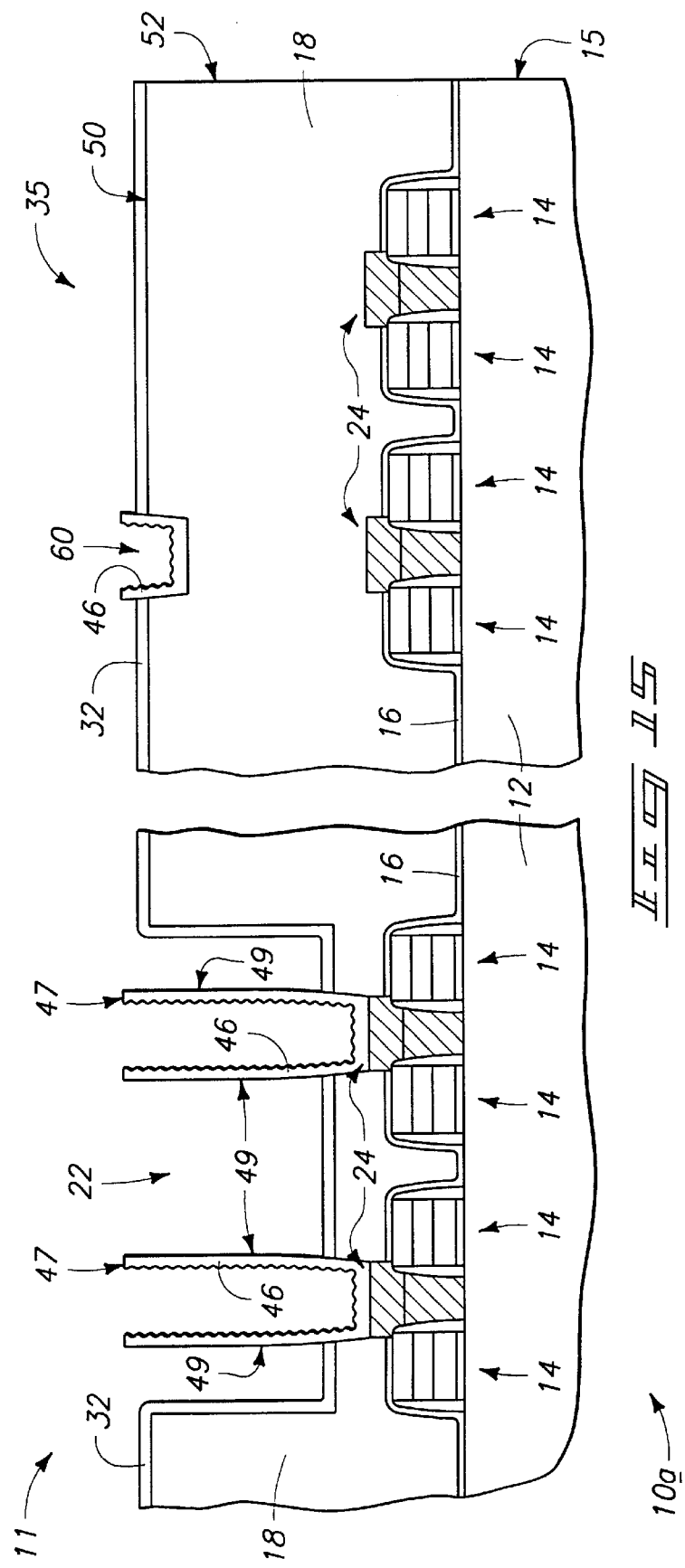
FIG. 15 is a view of the FIG. 5 wafer fragment at a processing step subsequent to that shown by FIG. 14.

Referring to FIG. 15, at least some of capacitor storage node forming layer 40 is removed from within wells 22. Preferably, such removal occurs by chemical etching using a chemistry which is substantially selective to remove capacitor storage node forming layer 40 relative to layer 32, and as well exposes lateral outer container surfaces 49 of the illustrated capacitor containers. As illustrated and preferred, substantially all of capacitor storage node forming layer 40 is shown as having been etched from the substrate using layer 32 as an etch stop. Where layer 40 comprises BPSG and layer 32 comprises silicon nitride, an exemplary chemistry is dilute HF at a 10:1 volume ratio. Further as shown, the absence of a tank or well 22 in peripheral rim portion 50 of insulative dielectric layer 18 enables anchoring or retaining of the subject and illustrated potentially deformed container relative thereto. Further, the previously formed other container relative to opening 62 had preferably been removed by planarized removal of material 40 and capacitor storage node layer 46 in the processing to produce FIG. 14.

Figure 16:
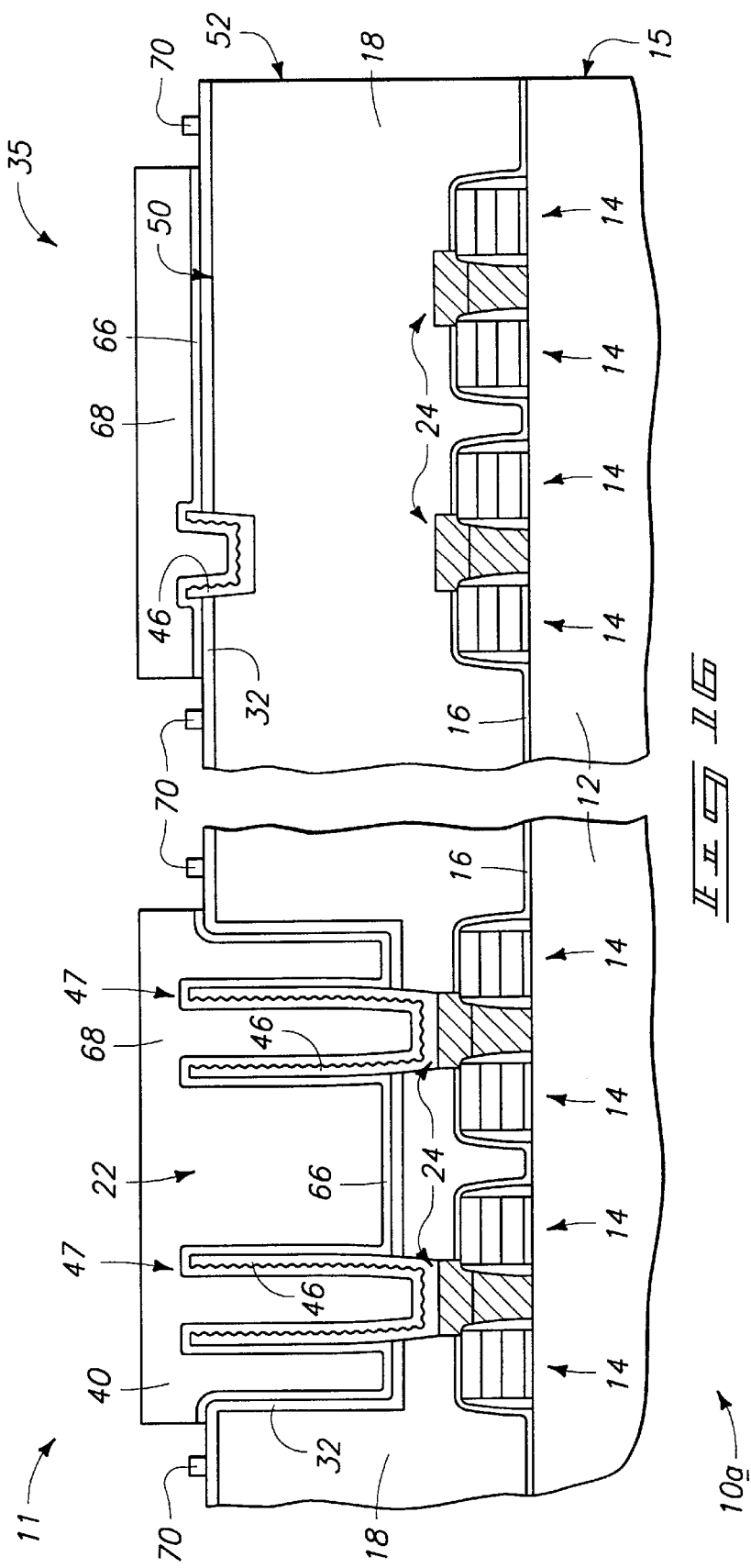
FIG. 16 is a view of the FIG. 5 wafer fragment at a processing step subsequent to that shown by FIG. 15.

Referring to FIG. 16, a capacitor dielectric layer 66 and a capacitor cell electrode layer 68 are formed over capacitor storage node containers 47, including outer surface area 49. Such provides but one example of forming an array of memory cell capacitors within wells 22 over word lines 14 and digit lines (not shown). Peripheral circuitry 70 is formed within the peripheral circuitry area and is operatively designed and configured to write to and read from the memory array, as is conventional or as yet-to-be-developed. Exemplary existing peripheral dynamic random access memory circuitry includes sense amplifier elements, equilibration and bias circuits, isolation devices, input/output transistors, etc. Exemplary devices 70 are shown only diagrammatically, as such are not being particularly germane to aspects of this invention.

Figure 17:
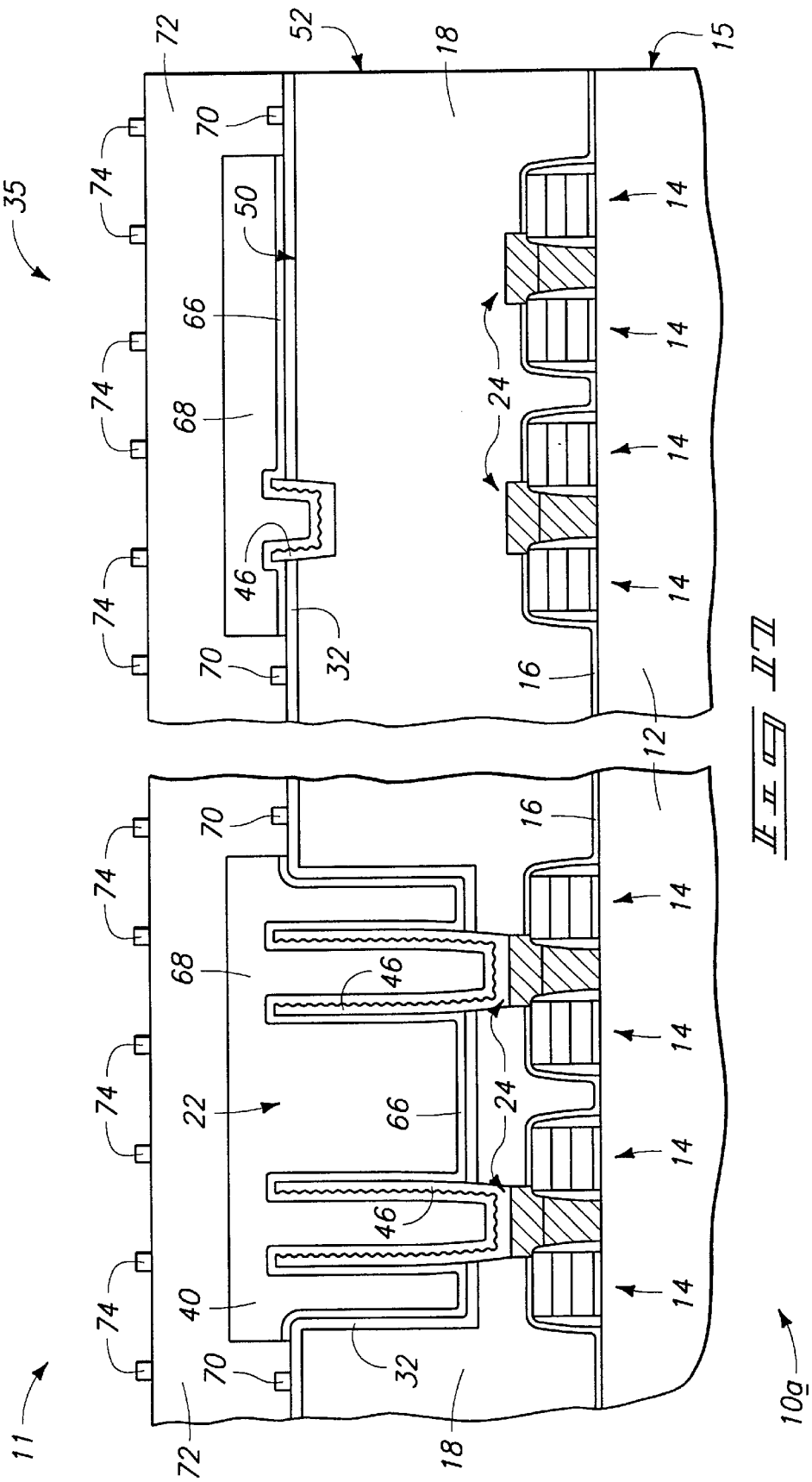
FIG. 17 is a view of the FIG. 5 wafer fragment at a processing step subsequent to that shown by FIG. 16.

Referring to FIG. 17, a planarized dielectric layer 72 and exemplary metal line/wiring components 74 are shown as being fabricated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming capacitors on a wafer, the wafer having a peripheral edge, the method comprising:

forming a dielectric well forming layer over the wafer;

forming a protective rim comprising photoresist over the well forming layer proximate to and along at least a portion of the wafer peripheral edge;

removing portions of the well forming layer radially inward of the protective rim, and while photoresist of the protective rim is on the wafer, to form a plurality of wells within the well forming layer; and forming a plurality of capacitors within individual of the plurality of wells such that said individual wells respectively have said plurality of capacitors therein.

2. The method of claim 1 wherein the photoresist comprises negative photoresist.

3. The method of claim 1 wherein the photoresist comprises positive photoresist.

4. A method of forming capacitors on a wafer, the wafer having a peripheral edge, the method comprising:

forming a dielectric well forming layer over the wafer;

forming a protective rim over the well forming layer proximate to and along at least a portion of the wafer peripheral edge;

removing portions of the well forming layer radially inward of the protective rim to form a plurality of wells within the well forming layer;

forming a plurality of capacitors within individual of the plurality of wells such that said individual wells respectively have said plurality of capacitors therein; and further comprising removing the protective rim prior to forming storage nodes of the plurality of capacitors.

5. The method of claim 1 wherein the protective rim is formed along all of the wafer peripheral edge.

6. The method of claim 1 wherein the removing comprises chemical etching.

7. The method of claim 1 comprising lining the wells with an etch stop layer prior to forming the plurality of capacitors.

8. The method of claim 1 comprising forming the protective rim to a width of at least 0.4 mm.

9. The method of claim 1 comprising forming the protective rim to a width of from 0.4 mm to 4.0 mm.

10. A method of forming capacitors on a wafer, the wafer having a peripheral edge, the method comprising:

forming a dielectric well forming layer over the wafer;
forming a protective rim over the well forming layer proximate to and along at least a portion of the wafer peripheral edge;
removing portions of the well forming layer radially inward of the protective rim to form a plurality of wells within the well forming layer;
forming a plurality of capacitors within individual of the plurality of wells such that said individual wells respectively have said plurality of capacitors therein; and
further comprising forming the protective rim to have a peripheral edge which is laterally coincident with the wafer peripheral edge.

11. A photolithographic method of forming capacitors on a wafer, the wafer having a peripheral edge, the method comprising:
forming a dielectric well forming layer over the wafer;
depositing photoresist over the well forming layer;
patterning the photoresist to at least a) leave a protective rim of the photoresist proximate to and along at least a portion of the wafer peripheral edge, and b) form a pattern of well openings through the photoresist radially inward of the peripheral edge portion;
using the patterned photoresist as a mask, etching the well forming layer to form a plurality of wells within the well forming layer radially inward of the portion of the wafer peripheral edge and not within the portion of the wafer peripheral edge; and
forming a plurality of capacitors within individual of the plurality of wells such that said individual wells respectively have said plurality of capacitors therein.

12. The method of claim 11 wherein the photoresist comprises negative photoresist.

13. The method of claim 11 wherein the protective rim is formed along all of the wafer peripheral edge.

14. The method of claim 11 comprising lining the wells with an etch stop layer prior to forming the plurality of capacitors.

15. The method of claim 11 comprising forming the protective rim to a width of from 0.4 mm to 4.0 mm.

16. The method of claim 11 comprising forming the protective rim to have a peripheral edge which is laterally coincident with the wafer peripheral edge.

17. A photolithographic method of forming capacitors on a wafer, the wafer having a peripheral edge, the method comprising:
forming a dielectric well forming layer over the wafer;
blanket depositing negative photoresist over the wafer over the well forming layer;
stepping and exposing a clear-field reticle over an entirety of the wafer over the blanket deposited negative photoresist, the clear-field reticle having masking regions comprising a plurality of well forming regions, the stepping and exposing thereby forming a pattern of well forming regions in the negative photo resist;
using a wafer edge exposure tool, exposing a peripheral edge portion of the negative photoresist proximate to and all about the periphery of the wafer;
after the stepping and exposing with the clear-field reticle, after using the wafer edge exposure tool, and using the negative photoresist as a mask, etching the well forming layer to form a plurality of wells within the well forming layer radially inward of the peripheral edge portion and not within the peripheral edge portion; and
forming a plurality of capacitors within individual of the plurality of wells such that said individual wells respectively have said plurality of capacitors therein.

18. The method of claim 17 comprising using the wafer edge exposure tool prior to the stepping and exposing with the clear-field reticle.

19. The method of claim 17 comprising using the wafer edge exposure tool after the stepping and exposing with the clear-field reticle.

20. The method of claim 17 wherein the masking regions are opaque.

21. The method of claim 17 comprising lining the wells with an etch stop layer prior to forming the plurality of capacitors.

22. The method of claim 17 comprising forming the peripheral edge portion to a width of from 0.4 mm to 4.0 mm.

23. The method of claim 17 comprising forming the peripheral edge portion to have a peripheral edge which is laterally coincident with the wafer peripheral edge.

24. A method of forming capacitors on a wafer, the wafer having a peripheral edge, the method comprising:
forming a dielectric well forming layer over the wafer;
forming a protective rim over the well forming layer proximate to and along at least a portion of the wafer peripheral edge;
removing portions of the well forming layer radially inward of the protective rim to form a plurality of wells within the well forming layer;
forming a capacitor storage node forming layer within the wells;
forming an array of first capacitor storage node openings within the capacitor storage node forming layer within individual of the wells and an array of second openings at least some of which extend into the dielectric well forming layer peripherally of the wells;
depositing a capacitor storage node electrode layer within the first capacitor storage node openings and the second openings; and
after depositing the capacitor storage node electrode layer, removing at least some of the capacitor storage node forming layer from within the wells.

25. The method of claim 24 lining the well with an etch stop layer prior to forming the capacitor storage node forming layer, the second openings extending through the etch stop layer into the dielectric well forming layer.

26. The method of claim 24 comprising removing the protective rim prior to forming the capacitor storage node forming layer.

27. The method of claim 24 comprising in a common step, planarize polishing the capacitor storage node electrode layer and the capacitor storage node forming layer prior to the removing of at least some of the capacitor storage node forming layer from within the wells.

28. The method of claim 24 wherein the protective rim comprises photoresist.

29. The method of claim 28 wherein the photoresist comprises negative photoresist.

30. The method of claim 28 wherein the photoresist comprises positive photoresist.

31. The method of claim 28 comprising forming the protective rim to a width of at least 0.4 mm.

32. The method of claim 28 comprising forming the protective rim to a width of from 0.4 mm to 4.0 mm.

33. A method of forming capacitors on a wafer, the wafer having a peripheral edge, the method comprising:
forming a dielectric well forming layer over the wafer;
forming a protective rim over the well forming layer proximate to and along at least a portion of the wafer peripheral edge;

removing portions of the well forming layer radially inward of the protective rim to form a plurality of wells within the well forming layer;

forming a capacitor storage node forming layer within the wells and over the well forming layer peripherally of the wells;

forming an array of first capacitor storage node openings within the capacitor storage node forming layer within individual of the wells and an array of second openings within the capacitor storage node forming layer peripherally of the wells;

depositing a capacitor storage node electrode layer within the first capacitor storage node openings and the second openings;

after depositing the capacitor storage node electrode layer, planarize removing some of it and some of the capacitor storage node forming layer back in a blanket manner relative to the wafer; and after the planarize removing, removing at least some of the capacitor storage node forming layer from within the wells.

34. The method of claim 33 comprising forming most of the second openings to extend into the well forming layer.

35. The method of claim 33 comprising forming at least some of the second openings to extend into the well forming layer.

36. The method of claim 35 comprising forming only some of the second openings to extend into the well forming layer.

37. The method of claim 33 wherein the protective rim comprises photoresist.

38. The method of claim 37 wherein the photoresist comprises negative photoresist.

39. The method of claim 37 wherein the photoresist comprises positive photo resist.

40. The method of claim 37 comprising forming the protective rim to a width of at least 0.4 mm.

41. The method of claim 37 comprising forming the protective rim to a width of from 0.4 mm to 4.0 mm.

* * * * *

UNITED STATES PATENT AND TRADEMARK OFFICE
CERTIFICATE OF CORRECTION

PATENT NO. : 6,423,609 B1
DATED : July 23, 2002
INVENTOR(S) : John F. Van Itallie It is certified that error appears in the above-identified patent and that said Letters Patent is hereby corrected as shown below:

Column 6,
Line 62, replace "but is significantly less a preferred in light of" with -- but is significantly less preferred in light of --

Column 7,
Line 37, replace "ably in a common planarizing step, caparcitor" with -- ably in a common planarizing step, capacitor --

Signed and Sealed this

Fourth Day of March, 2003

JAMES E. ROGAN
*Director of the United States Patent and Trademark Office*